United States Patent [19]

Mori et al.

[11] Patent Number: 5,289,126
[45] Date of Patent: Feb. 22, 1994

[54] MAGNETIC RESONANCE IMAGING APPARATUS

[75] Inventors: Kiyomi Mori; Yoshinori Suzuki, both of Yokohama, Japan

[73] Assignee: Kabushiki Kaisha Toshiba, Kawasaki, Japan

[21] Appl. No.: 842,497

[22] Filed: Feb. 27, 1992

[30] Foreign Application Priority Data

Jul. 23, 1991 [JP] Japan .................................. 3-182631

[51] Int. Cl.$^5$ ............................................. G01V 3/00
[52] U.S. Cl. ..................................... 324/309; 324/307
[58] Field of Search ............... 324/300, 307, 309, 312; 128/653.2

[56] References Cited

U.S. PATENT DOCUMENTS 4,789,831 12/1988 Mayo, Jr. ............................ 324/309
5,038,786 8/1991 Kojima .................................. 324/307

OTHER PUBLICATIONS

Magnetic Resonance In Medicine, vol. 7, No. 3, Jul. 1988, pp. 319-336, P. A. Bottomley, et al., "Human In Vivo Phosphate Metabolite Imaging With $^{31}$P NMR". Diagnostic Imaging, Dec. 1989, pp. 48-52, & 143, M. W. Weiner, "MR Spectroscopic Imaging Approaches Clinical Realm".

Primary Examiner—Louis Arana
Attorney, Agent, or Firm—Oblon, Spivak, McClelland, Maier & Neustadt

[57] ABSTRACT

A magnetic resonance imaging apparatus reconstructs proton image data and chemical shift image data of, for example, a phosphorous compound from first and second magnetic resonance signals obtained from the same position of an object under examination. Display/non-display region decisions are made for the chemical shift image data by referring to the proton image data. Of the chemical shift image data, data present in display regions are displayed together with the proton image data.

16 Claims, 11 Drawing Sheets

NON-DISPLAY REGIONS

DISPLAY REGIONS

MAGNETIC RESONANCE IMAGING APPARATUS

BACKGROUND OF THE INVENTION

1. Field of the Invention

The present invention relates to a magnetic resonance imaging apparatus and, more particularly, to a magnetic resonance imaging apparatus for imaging information on spin density, chemical shifts, etc., of specific atomic nuclei existing within a local region of an object under examination.

2. Description of the Related Art

Magnetic resonance imaging apparatus is apparatus which acquires chemical and physical information of substances in the form of magnetic resonance signals and reconstructs an image from the signals by utilizing resonance absorption of radio-frequency magnetic field energy at specific frequencies by atomic nuclei having intrinsic magnetic moments and placed in a static magnetic field.

In living biological tissue there exist chemical substances having atomic nuclei, such as $^1H$, $^{13}C$, $^{23}Na$ and $^{31}P$, which produce such magnetic resonance signals. These substances take part in the metabolism of the biological tissue. Especially, $^{31}P$ compounds, such as PCr (creatine phosphate), ATP (adenosine triphosphate), ADP (adenosine diphosphate), etc., and $^{31}P$ (phosphorus) existing in biological tissue as Pi (inorganic phosphorous) take part in various types of energy metabolism (acquisition, conservation and consumption of energy), The measurement of density ratios and density distributions of these substances is very useful in evaluating the physiological activity of biological tissues. The use of magnetic resonance imaging apparatus makes it possible to identify and quantitatively determine specific atomic nuclei, such as $^1H$, $^{13}C$, $^{23}Na$ and $^{31}P$, for each of their compounds. By imaging those atomic nuclei as chemical shift images, a spatial distribution of each of the compounds can be obtained.

In diagnosis using a chemical shift image of a phosphorous compound, it is usual practice to display a proton image and a chemical shift image of a phosphorous compound and make a comparison between them for identification and quantitative determination of the phosphorous compounds. The detection sensitivity for magnetic resonance signals of phosphorous compounds is so low as to be about $1/10^5$ of that of protons. In order to acquire magnetic resonance signals of a phosphorous compound with required signal-to-noise ratios, therefore, it is necessary to increase the volume of a voxel. A chemical shift image of a phosphorous compound is small in the total number of voxels within an imaging region as compared with a proton image, resulting in reduction of spatial resolution.

Figure 6:
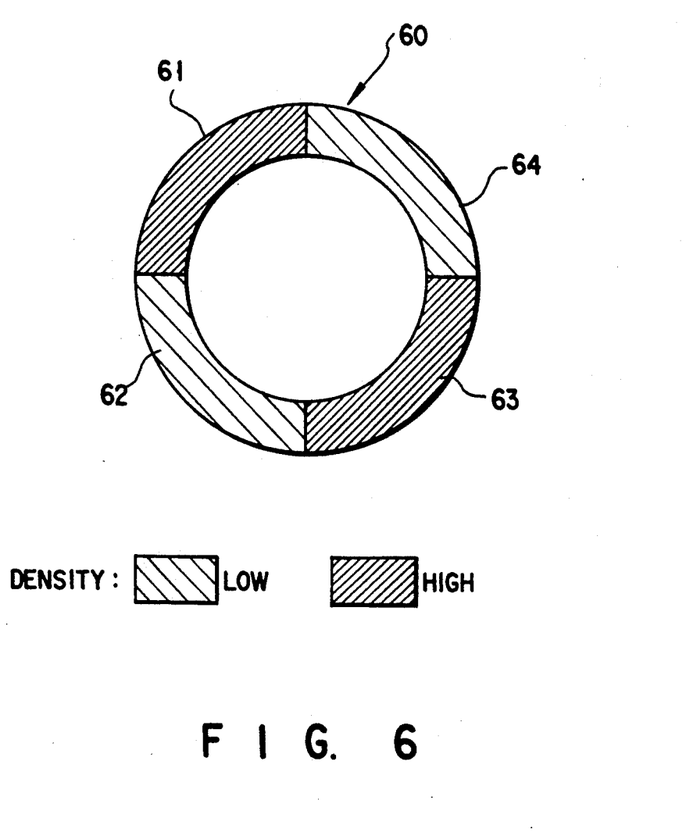
FIG. 6 is a diagrammatic representation of a phantom used in the embodiment of FIG. 1.
Figure 12A:
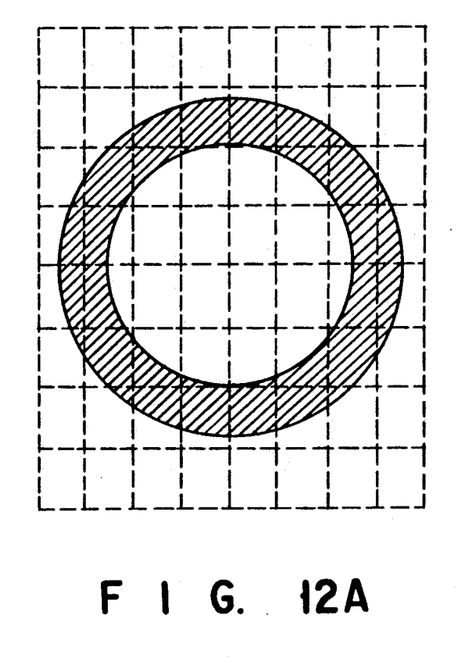
FIGS. 12A and 12B illustrate proton image data and chemical shift image data, respectively, obtained from the phantom of FIG. 6 by using a prior imaging technique.
Figure 12B:
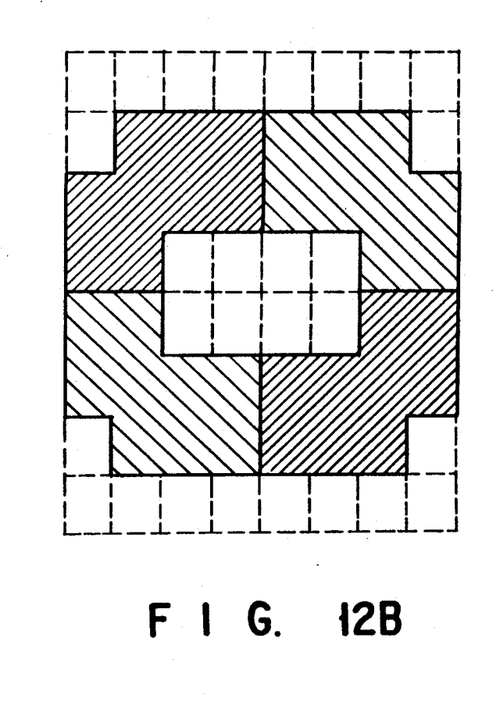

This problem will be discussed taking, by way of example, chemical shift imaging which was actually conducted by the inventors of the present invention using a phantom. Such a phantom as shown in FIG. 6 was prepared. This phantom has an annular-type container 60 which is partitioned into four compartments 61, 62, 63 and 64, the rooms 61 and 63 being filled with a highly concentrated solution of phosphoric acid and the compartments 62 and 64 being filled with a lowly concentrated solution of phosphoric acid. In FIG. 12A there is shown a proton image obtained from a slice of the phantom, which is parallel to the drawing sheet, taking the phantom as a sample to be examined. In FIG. 12B there is shown a chemical shift image of the phosphorous compound which was obtained from the same slice as the proton image of FIG. 12A using the conventional imaging method. In order to indicate a correspondence in position between the images, grid lines (indicated by broken lines) representing an imaging matrix (data acquisition matrix) of the chemical shift image are displayed on the proton image as shown in FIG. 12A. A doctor performs identification and quantitative determination while making a comparison between the chemical shift image of FIG. 12B and the proton image of FIG. 12A.

As can be seen from FIG. 12B, however, the chemical shift image of the phosphorous compound is coarse and low in spatial resolution as compared with the proton image of FIG. 12A. The reason is that the volume of each voxel is made large as described above in order to make the signal-to-noise ratio high in obtaining magnetic resonance signals of a phosphorous compound. As a result, it becomes difficult to understand the positional relationship between a chemical shift image of a phosphorous compound and an object to be measured. Thus, there arises a problem that it is difficult to accurately understand the distribution of a phosphorous compound which is a candidate for chemical shift imaging.

SUMMARY OF THE INVENTION

It is an object of the present invention to provide a magnetic resonance imaging apparatus which, in low-resolution imaging such as chemical shift imaging, permits the positional relationship between a low-resolution image and an imaging substance to be understood definitely.

According to the present invention, first and second different types of magnetic resonance signals are obtained from the same position of an object under examination, high-resolution image data such as proton image data is reconstructed from the first magnetic resonance signals, and low-resolution image data such as specific chemical shift image data is reconstructed from the second magnetic resonance signals. Display/non-display region decisions are made for the low-resolution image data by referring to the high-resolution image data. Low-resolution image data present in display regions are displayed. For the display/non-display decisions, a threshold value is set to the high-resolution image data. Regions greater than the threshold value are output as display regions where the low-resolution image data is to be displayed. In displaying, the high-resolution image may be displayed together with the low-resolution image. In this case, the two images may be displayed in separate areas adjacent to each other or in the same area in such a manner that they can be distinguished from each other.

According to an aspect of the present invention, the high-resolution image data is reconstructed on a matrix with a predetermined number of elements, while the low-resolution image data is reconstructed on a matrix which is smaller in the number of elements than the matrix for the high-resolution image data. The number of elements forming the matrix for the reconstructed low-resolution image data is changed so that the low-resolution image may be about the size of the high-resolution image. Of the resultant low-resolution image data, data present in regions output as display regions are displayed. The change of the number of matrix elements is made by performing, for example, an interpolation process on the low-resolution image data. By the interpolation process the low-resolution image data is subjected to smoothing.

According to the other aspect of the present invention, the high-resolution image and the low-resolution image may be displayed superimposed upon each other. In this case, it is desired that the two images be displayed in such a manner that they can be distinguished from each other, for example, in different colors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
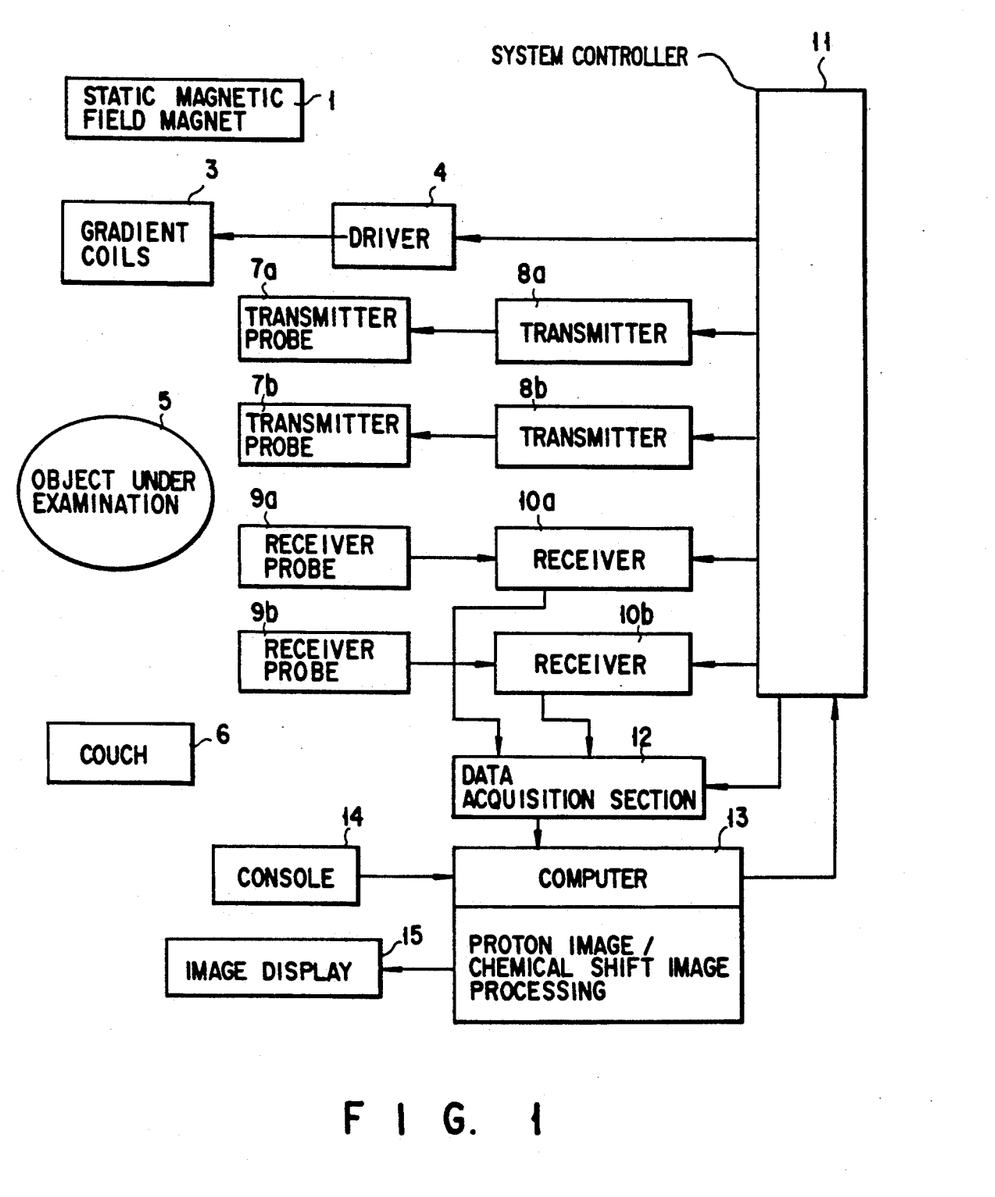
FIG. 1 is a block diagram of a magnetic resonance imaging apparatus embodying the present invention.

Referring now to FIG. 1, a magnetic resonance imaging apparatus embodying the present invention comprises a static magnetic field forming magnet 1, gradient coils 3, a gradient coil driver circuit 4, transmitter probes 7a and 7b, transmitters 8a and 8b, receiver probes 9a and 9b, receivers 10a and 10b, a system controller 11, a data acquisition section 12, an electronic computer 13, a console 14 and a display unit 15. The static field forming magnet 1 applies a uniform static magnetic field to an object under examination (for example, a human body) 5 lying on a couch 6. The gradient coil means 3 are driven by the driver circuit (amplifier) 4 under the control of the system controller 11 to apply to the object under examination 5 linear gradient magnetic fields Gx, Gy, Gz whose strengths are proportional to distances in the three mutually orthogonal X, Y, Z directions. The object under examination 5 is further subjected to radio-frequency magnetic fields generated by the transmitter coils 7a and 7b supplied with radio-frequency signals from the transmitters 8a and 8b under the control of the system controller 11. By applying the static magnetic field, gradient magnetic fields and radio-frequency magnetic field, magnetic resonance signals relating to various types of atomic nuclei are generated from the object 5. Magnetic resonance signals of first and second nuclear species are received by the receiver coils 9a and 9b, respectively. These signals are amplified and detected by the receivers 10a and 10b and then fed into the data acquisition section 12 under the control of the system controller 11. The data acquisition section 12 converts the magnetic resonance signals to digital form and sends digital data to the computer 13 as image reconstruction data.

The computer 13 is controlled by the console 14 and performs image reconstruction processing including Fourier transform on the image reconstruction data input from the data acquisition section 12. The computer 13 also controls the system controller 11. Image data reconstructed by the computer 13 is sent to the display unit 15, which may comprise a CRT display.

In the present embodiment, the transmitter and receiver coils are provided separately. Alternatively, one probe may be used for transmission and reception for each of nuclear species. Moreover, the probes may be replaced according to types of nuclear species ($^1$H, $^{31}$P, etc.) whose magnetic resonance signals are to be acquired. Furthermore, a multi-tuning type of coil may be used for the probe. No matter what type probes may be used, they receive magnetic resonance signals of plural types of nuclear species from the same position because the gradient coils 3 are stationary. Thereby, a proton image and a chemical shift image will correspond in position to each other, which will be described later.

Next, the imaging procedure of a proton image and a chemical shift imaging according to the present embodiment will be described with reference to a flowchart illustrated in FIG. 2.

First, magnetic resonance signals of protons ($^1$H) are obtained by using a conventional art magnetic resonance imaging technique (Step S1). Proton image data is reconstructed from the magnetic resonance signals (Step S2) and then stored in a memory (Step S3). The proton image data is formed into a 256×256 matrix or a 512×512 matrix in the memory.

Next, magnetic resonance signals of a phosphorous compound are obtained by using a known chemical shift imaging technique (Step S4). A chemical shift image of the phosphorous compound is reconstructed from the magnetic resonance signals (Step S5). The magnitude of the magnetic resonance signals of the phosphorous compound is small. Thus, in order to improve the signal-to-noise ratio, the volume of each of voxels of the chemical shift image data of the phosphorous compound is made large. For this reason, the number of elements or data points forming a matrix for chemical shift image data is much smaller than that for proton image data and chosen to be, for example, 16×16 or 32×32.

Figure 3:
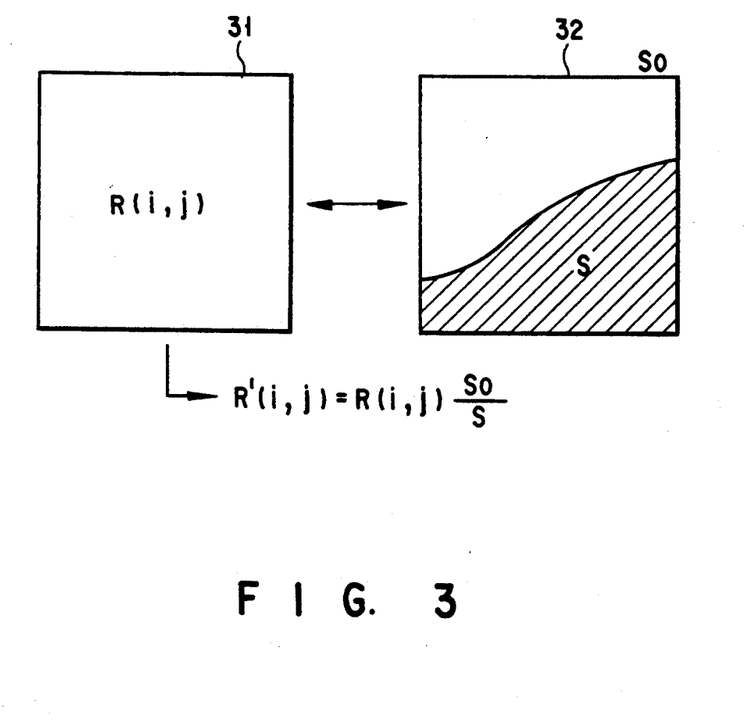
FIG. 3 is a diagram for use in explanation of the principle of correction for the partial volume effect in the embodiment of FIG. 1.

Next, correction for the partial volume effect of the reconstructed chemical shift image data is made using the proton image data (step S6). FIG. 3 illustrates how to correct the partial volume effect. Signal strength R(i, j) within a block 31 of a predetermined size of the chemical shift image data is corrected according to the proportion of the area where signals are present within a block 32 of the proton image data, corresponding to the block 31 of the chemical shift image data, to the entire block 32. That is, the correction is made as follows:

$$R(i,j) \rightarrow R'(i,j) = (R(i,j)) So/S$$

where So stands for the area (or volume) of the entire block 32 and S stands for the area (or volume) where signals are present within the block 32. The block 31 of the chemical shift image data corresponds to a voxel at the time of acquisition of chemical shift image data. When the probes are not uniform in sensitivity, correction for sensitivity distributions of the probes can also be made.

If chemical shift image data is displayed simply, the display density (brightness) will be reduced in regions where there is little signal because the signal strength is reduced. For this reason, in those regions it will be difficult to recognize the distribution of a compound which is a candidate for chemical shift imaging. In contrast to this case, making the above-described correction for the partial volume effect permits the signal strength of chemical shift image data to be made large in regions where the percentage of signals contained in proton image data is small (i.e., regions where there is little signal in chemical shift image data). For this reason, a displayed chemical shift image has a substantially uniform density (or brightness) in regions where signals are present and thus an image that is good in quantitative determination will be obtained. This technique of correcting the partial volume effect is generally effective in low-resolution imaging such as chemical shift imaging.

Referring back to FIG. 2, following the correction for the partial volume effect (step S6), the number of elements forming the matrix for chemical shift image data is changed such that a proton image and a chemical shift image become substantially identical to each other in size (step S7). As the technique of changing the number of matrix elements, for example, a smoothing process based on an interpolation method can be performed on chemical shift image data. Although various interpolation methods are known, a technique called cubic convolution interpolation is suitable. By applying the smoothing process based on such an interpolation method, the chemical shift image can be more easily visualized. Note that steps S6 and S7 may be reversed in order.

Figure 4:
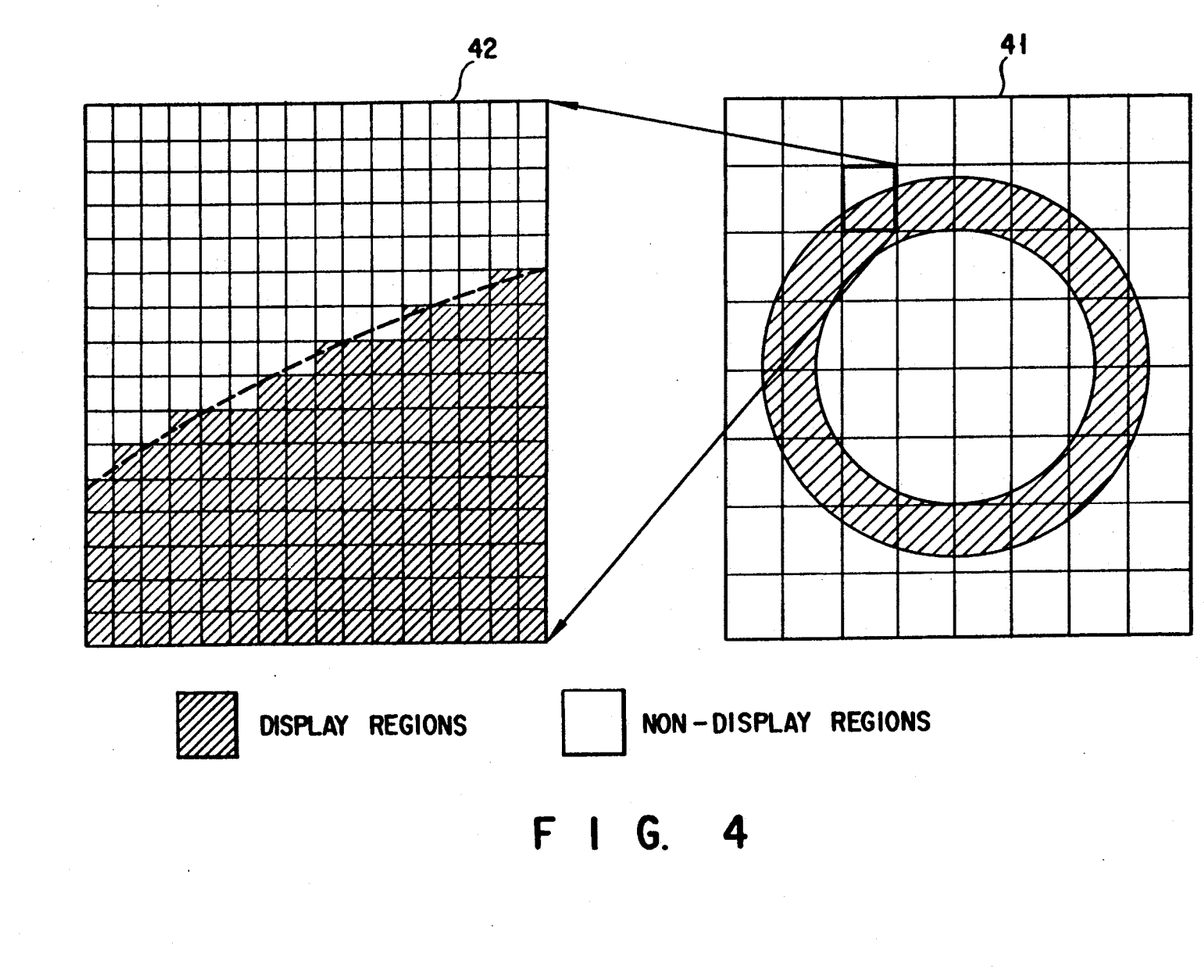
FIG. 4 illustrates how display regions of a chemical shift image are decided by using proton image data in the embodiment of FIG. 1.

Next, regions where chemical shift data is to be displayed are decided using proton image data (step S8). An example of a specific method of making display/nondisplay region decisions will be described with reference to FIGS. 4 and 5. FIG. 4 illustrates proton image data 41 and the results of the display region decisions obtained for the proton image data 41 proton image data 42). A suitable threshold value is set to the proton image data 41. In the proton image data 41 voxels which are not less than the threshold value are output as display regions where a chemical shift image is to be displayed because of the presence of magnetic resonance signals of protons. On the other hand, voxels which are less than the threshold value are output as non-display regions where the chemical shift image is not to be displayed because of the absence of magnetic resonance signals of protons. In FIG. 4, shaded squares represent regions regarded as display regions where the chemical shift image is to be displayed, while white squares represent regions where the chemical shift image is not to be displayed. As a method of making display/nondisplay region decisions in step S8, use may be made of the region growing method which is well known in the field of image processing or the like.

Figure 5:
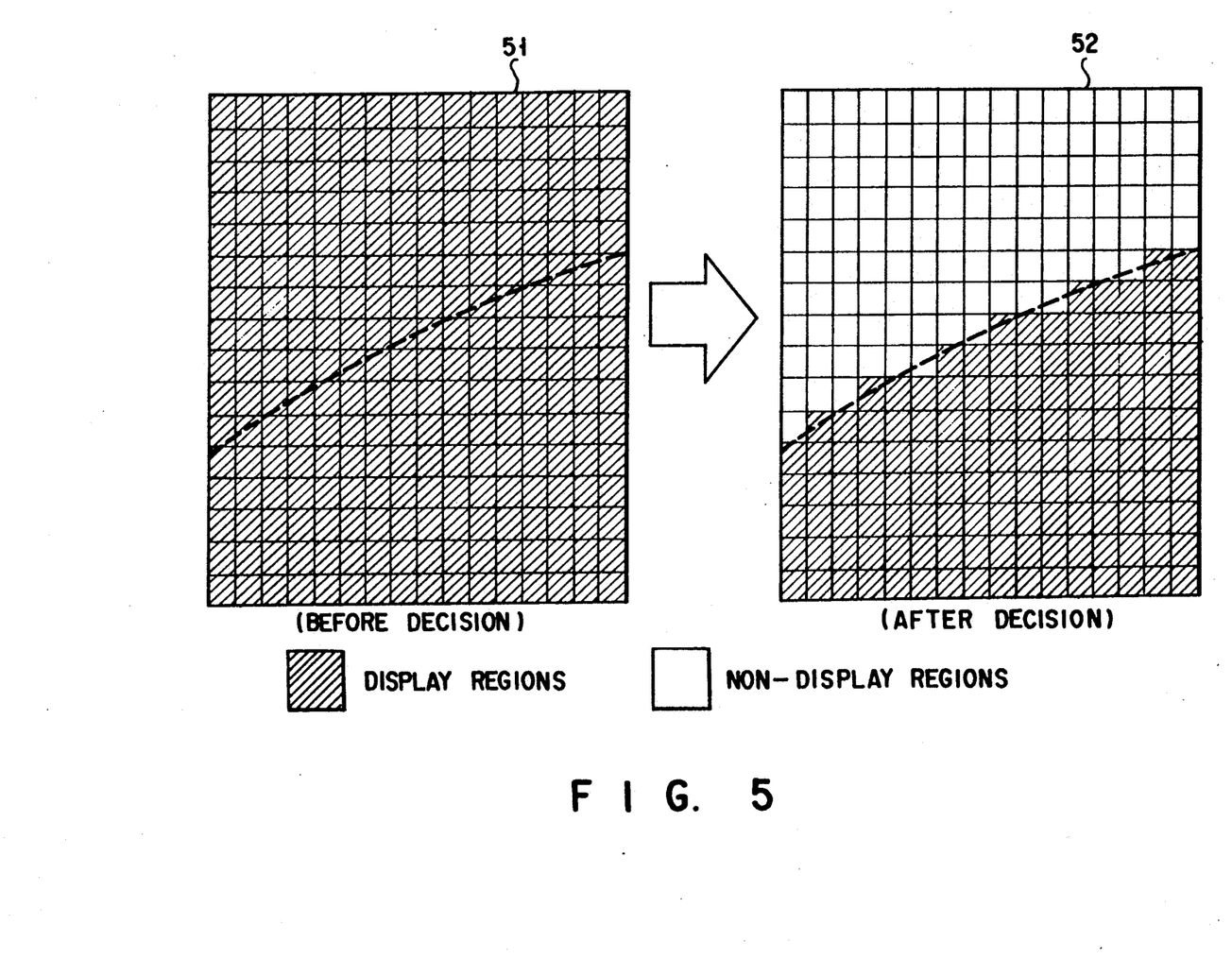
FIG. 5 illustrates the result of application of the results of the display region decisions of FIG. 4 to the chemical shift image.

FIG. 5 illustrates chemical shift image data 51 after the change of the number of matrix elements in step S7 and chemical shift image data 52 after application of the results 42 of the display/non-display region decisions of FIG. 4 to the chemical shift image data 51. As in FIG. 4, shaped squares represent display regions, while white squares represent non-display regions. In the chemical shift image data 51, display regions and non-display regions are defined in chemical shift image voxel units before the change of the number of matrix elements. In the chemical shift image data 52 to which the results of the display/non- region decision 42 for the proton image data 41 have been applied, on the other hand, display regions and non-display regions are defined in units of a voxel after the change of the number of matrix elements, in voxel units of the same size as a voxel of the proton image data 41.

Next, only regions regarded as display regions are extracted from the chemical shift image data after the change of the number of matrix elements and then the regions and the proton image data which has already been obtained are displayed on the display unit 15 (Steps S9 and S10).

Figure 2:
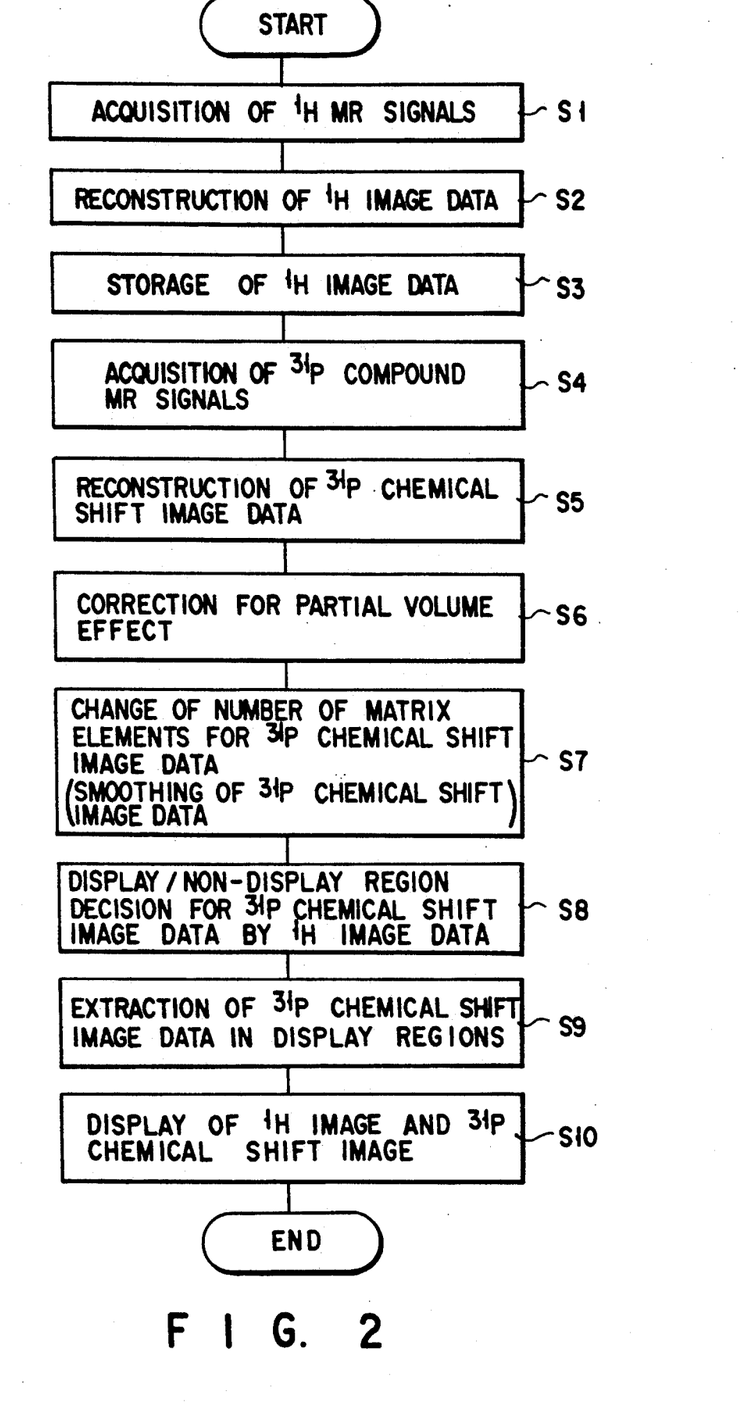
FIG. 2 is a flowchart of the imaging procedure for a proton image and a chemical shift image in the embodiment of FIG. 1.
Figure 7A:
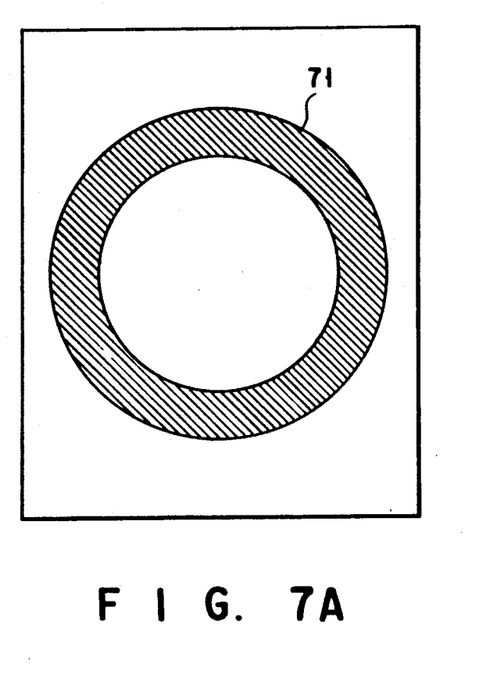
FIG. 7A is a diagrammatic representation of proton image data of the phantom of FIG. 6 obtained by the embodiment of FIG. 1.
Figure 7B:
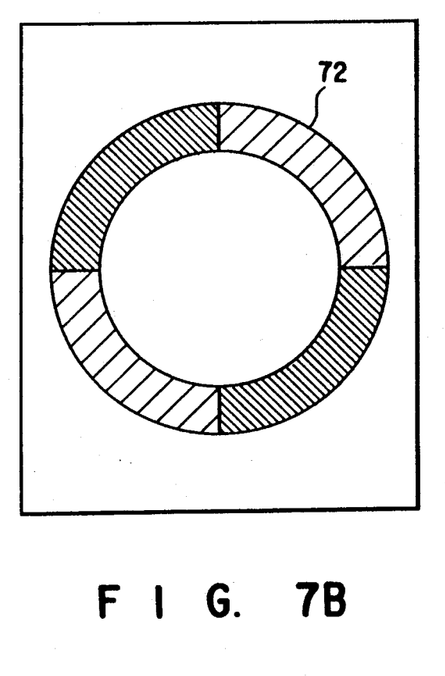
FIG. 7B is a diagrammatic representation of chemical shift image data of the phantom of FIG. 6 obtained by the embodiment of FIG. 1.

FIG. 7A and FIG. 7B illustrate a proton image and a chemical shift image of a phosphorous compound, respectively, which are obtained by applying the procedure shown in FIG. 2 to such a phantom as shown in FIG. 6. As s evident from comparison with FIGS. 12A and 12B which are based on the conventional method, the chemical shift image obtained in the present embodiment is displayed only in substantially the same area as the proton image, in other words, only in the area where signals are actually present, thus facilitating the understanding of a correspondence relationship between the chemical shift image and the proton image.

Figure 8:
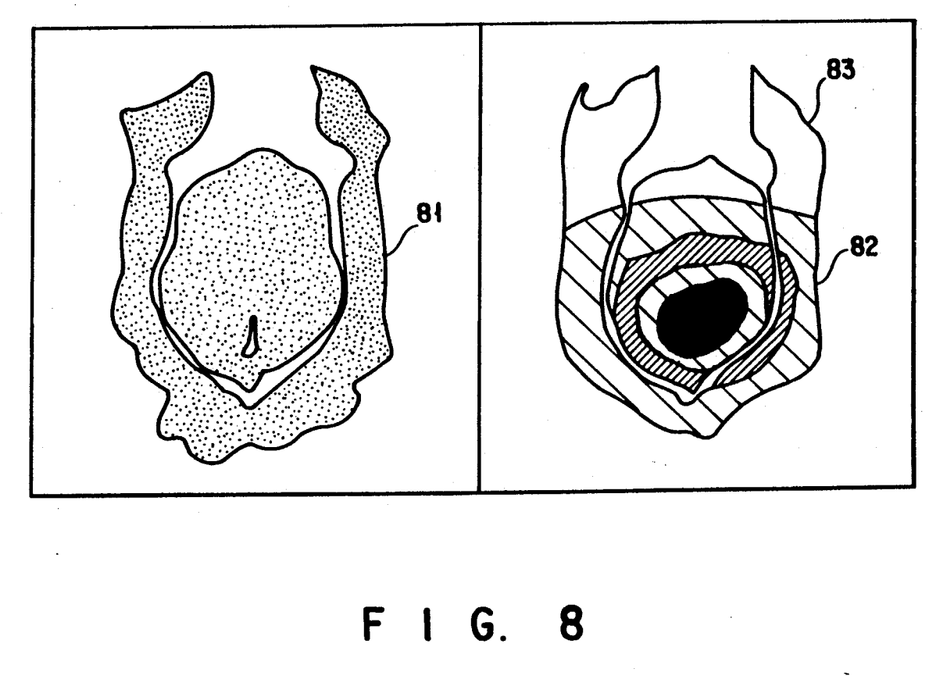
FIG. 8 illustrates a display example of a proton image and a chemical shift image obtained by the embodiment display example of FIG. 8.

FIG. 8 illustrates a proton image 81 and a chemical shift image 82 of a phosphorous compound which were obtained from the head of a cat by actually using the method of the present embodiment. The chemical shift image 82 is displayed only within display regions 83 determined from the proton image 81 and regions other than the regions 83 are masked. The proton image 81 is displayed in monochrome, while the chemical shift image 83 is displayed in pseudo colors varying with densities, though it is not apparent from the drawing which is illustrated in black and white.

Figure 9:
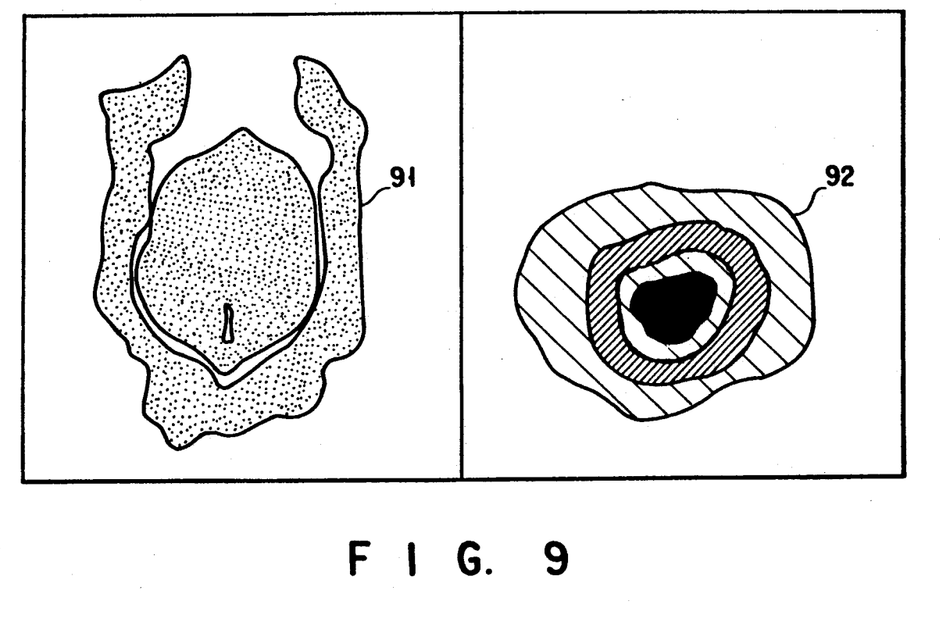
FIG. 9 illustrates a display example of a proton image and a chemical shift image for comparison with the display of FIG. 8.

In FIG. 9, as an example for comparison with FIG. 8, there are illustrated a proton image 91 and a chemical shift image 92 of a phosphorous compound which were obtained from the head of a cat using the conventional imaging method. The chemical shift image 92 is confusing because it is displayed even in regions where signals are not actually present. It is also difficult to understand the positional correspondence relationship with the proton image 91. It is therefore difficult to understand how the phosphorous compound distributes.

Figure 10:
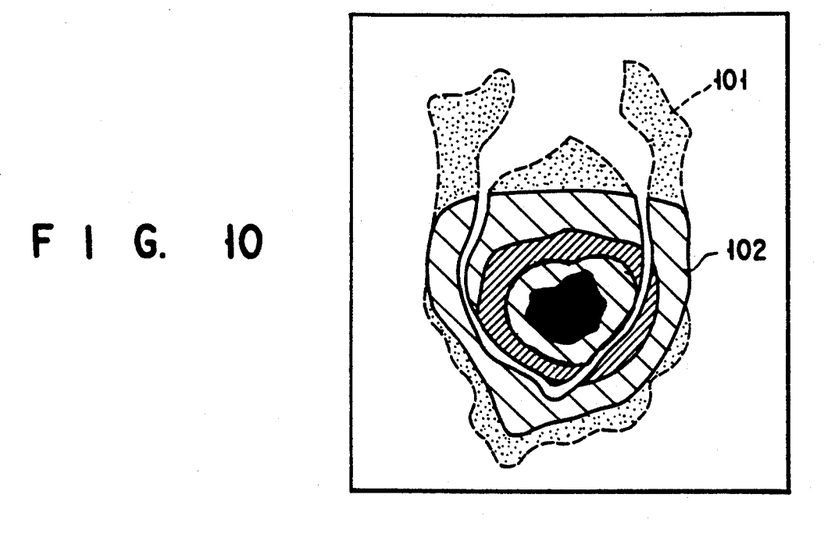
FIG. 10 illustrates a display example of a proton image and a chemical shift image according to the embodiment of FIG. 1.

In FIG. 8, the proton image 81 and the chemical shift image 82 are displayed in separate positions on the screen. Alternatively, as shown in FIG. 10, a proton image 101 and a chemical shift image 102 may be displayed superimposed upon each other while establishing the positional correspondence therebetween. In this case, the proton image 101 can be displayed in a light color tone, while the chemical shift image 102 can be displayed in pseudo colors, thereby facilitating discrimination therebetween. In the chemical shift image 102 of FIG. 10, portions in non-display regions determined from the proton image 101 are masked as in the case of FIG. 8.

Figure 11:
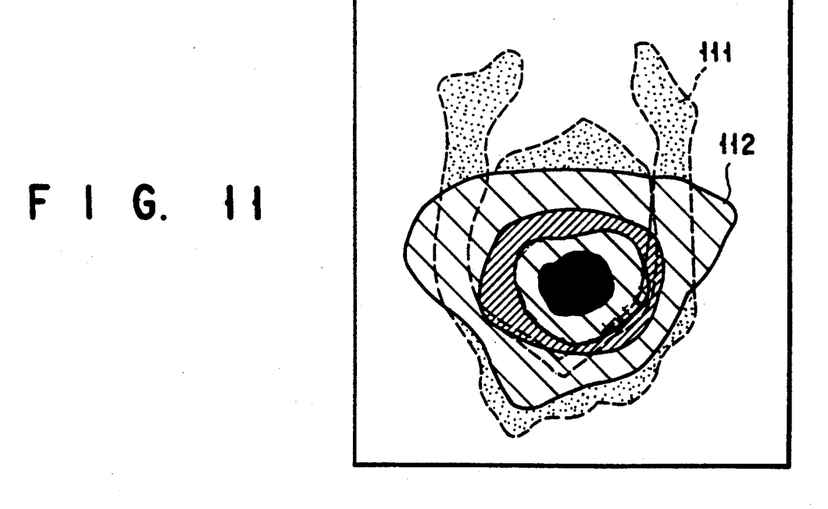
FIG. 11 illustrates a, display example of a proton image and a chemical shift image according to the other embodiment.

As still another alternative, a proton image 111 and a chemical shift image 112 which is not subjected to masking may be displayed superimposed upon each other as shown in FIG. 11. As in FIG. 10, the proton image 111 is displayed in a light color tone, while the chemical shift image 112 is displayed in pseudo colors. With this method of display, though the chemical shift image 112 is displayed even in regions where signals are not actually present, a doctor can easily recognize regions where signals are actually present by the outline of the proton image 111.

Though, in the above embodiment, a high-resolution image and a low-resolution image are illustrated by a proton image and a chemical shift image of a phosphorous compound, respectively, this is only illustrative and not restrictive. As another example of high-resolution image data, that image data of chemical shift data is given which is relatively large in signal strength and thus needs not to enlarge voxels. Such high-resolution image data can be used to determine display regions of low-resolution image data which is low in signal strength and thus needs to enlarge voxels. The present invention is also effective in displaying image data for the same nuclear species, for example, water data and lactic acid data of proton image data. In this case, a single transmitter probe, a single receiver probe, a single transmitter and a single receiver have only to be provided in order to obtain magnetic resonance signals.

According to the present invention, as described above, of low-resolution image data, such as a chemical shift image of a phosphorous compound, data from only display regions where signals are present, which are determined on the basis of high-resolution image data such as a proton image, are displayed as an image. Thereby, the distribution of a substance which is a candidate for chemical shift imaging can be understood correctly and the substance can be identified and quantitatively determined. Therefore, the application of the present invention to a medical diagnostic apparatus permits proper diagnosis to be made efficiently.

In addition, by superimposing a low-resolution image and a high-resolution image upon each other by a display unit itself, portions of the low-resolution image where signals are actually present can be understood from the outline of the high-resolution image and the distribution of a chemical shift imaging substance can be understood correctly.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetic resonance imaging apparatus comprising:

acquisition means for acquiring first and second different magnetic resonance signals from the same position of an object under examination;

first image reconstruction means for reconstructing high-resolution image data from the first magnetic resonance signals;

second image reconstruction means for reconstructing low-resolution image data from the second magnetic resonance signals;

display/non-display region decision means for making display/non-display region decisions for the low-resolution image data by referring to the high-resolution image data, wherein said display/non-display region decision means sets a threshold value to the high-resolution image data and outputs regions where the high-resolution image data is greater than the threshold value as display regions where the low-resolution image data is to be displayed; and display means responsive to said display/non-display region decision means for displaying low-resolution image data present in regions output as display regions by said display/non-display region decision means.

2. A magnetic resonance imaging apparatus according to claim 1, in which said first image reconstruction means reconstructs proton image data as the high-resolution image data, and said second image reconstruction means reconstructs specific chemical shift image data as the low-resolution image data.

3. A magnetic resonance imaging apparatus according to claim 1, in which said display means displays low-resolution image data present in regions output as display regions by said decision means and the high-resolution image data in a position differing from the display position of the low-resolution image data.

4. A magnetic resonance imaging apparatus according to claim 1, in which said display means displays low-resolution image data present in regions output as display regions by said display/non-display region decision means and the high-resolution image data in different colors while superimposing them upon each other.

5. A magnetic resonance imaging apparatus according to claim 1, in which said display means displays the low-resolution image data in pseudo colors varying with signal strength.

6. A magnetic resonance imaging apparatus according to claim 1, further comprising correction means for correcting the signal strength of the low-resolution image data for each of predetermined blocks according to the proportion of the signal existing area in a corresponding one of blocks of the high-resolution image data to the entire block.

7. A magnetic resonance imaging apparatus comprising:

acquisition means for acquiring first and second different magnetic resonance signals from the same position of an object under examination;

first image reconstruction means for reconstructing high-resolution image data from the first magnetic resonance signals, the high-resolution image data being formed into a matrix with a predetermined number of elements;

second image reconstruction means for reconstructing low-resolution image data from the second magnetic resonance signals, the low-resolution image data being formed into a matrix which is smaller in the number of elements than said matrix for the high-resolution image data;

matrix element number changing means for changing the number of elements of said matrix for the low-resolution image data reconstructed by said second image reconstruction means so that the low-resolution image about the size of the high resolution image is output;

display/non-display region decision means for making display/non-display region decisions for the low-resolution image data by referring to the high-resolution image data, and wherein said display/non-display region decision means sets a threshold value to the high-resolution image data and outputs regions where the high-resolution image data is greater than the threshold value as display regions where the low-resolution image data is to be displayed; and display means responsive to said display/non-display region decision means for displaying low-resolution image data present in regions output as display regions by said display/non-display region decision means.

8. A magnetic resonance imaging apparatus according to claim 7, in which said matrix element number changing means performs an interpolation process on the low-resolution image data to thereby change the number of elements of said matrix for the low-resolution image data.

9. A magnetic resonance imaging apparatus comprising:

acquisition means for acquiring first and second different magnetic resonance signals from the same position of an object under examination.

first image reconstruction means for reconstructing high-resolution image data from the first magnetic resonance signals;

second image reconstruction means for reconstructing low-resolution image data from the second magnetic resonance signals;

smoothing means for performing a smoothing process on the low-resolution image data reconstructed by said second image reconstruction means;

display/non-display region decision means for making display/non-display region decisions for the low-resolution image data by referring to the high-resolution image data, and wherein said display/non-display region decision means sets a threshold valve to the high-resolution image data and outputs regions where the high-resolution image data is greater than the threshold value as display regions where the low-resolution image data is to be displayed; and display means responsive to said display/non-display region decision means for displaying low-resolution image data output from said smoothing means in regions output as display regions by said display/non-display region decision means.

10. A magnetic resonance imaging apparatus according to claim 9, in which said first image reconstruction means reconstructs the high-resolution image data on a matrix with a predetermined number of elements, said second image reconstruction means reconstructs the low-resolution image data on a matrix which is smaller in the number of elements than said matrix for the high-resolution image data, and said smoothing means performs the smoothing process on the low-resolution image data so that the low-resolution image data has substantially the same number of matrix elements as the high-resolution image data.

11. A magnetic resonance imaging apparatus according to claim 10, in which said smoothing means performs an interpolation process on the low-resolution image data to thereby smoothing the low-resolution image data.

12. A magnetic resonance imaging apparatus comprising:

acquisition means for acquiring first and second different magnetic resonance signals from the same position of an object under examination;

first image reconstruction means for reconstructing high-resolution image data from the first magnetic resonance signals;

second image reconstruction means for reconstructing low-resolution image data from the second magnetic resonance signals; and display means for displaying the high-resolution image data and the low-resolution image data superimposed upon each other.

13. A magnetic resonance imaging apparatus according to claim 12, in which said first image reconstruction means reconstructs proton image data as the high-resolution image data, and said second image reconstruction means reconstructs specific chemical shift image data as the low-resolution image data.

14. A magnetic resonance imaging apparatus according to claim 12, in which said display means displays each of the high-resolution image data and the low-resolution image data in a different color.

15. A magnetic resonance imaging apparatus according to claim 12, in which said display means displays the low-resolution image data in pseudo colors varying with signal strengths.

16. A magnetic resonance imaging apparatus according to claim 13, further comprising correction means for correcting the signal strength of the low-resolution image data for each of predetermined blocks according to the proportion of the signal existing area in a corresponding one of blocks of the high-resolution image data to the entire block.

* * * * *